United States Patent
Yamabayashi et al.

(10) Patent No.: US 6,895,031 B2
(45) Date of Patent: May 17, 2005

(54) LIGHT-EMITTING DEVICE, OPTICAL MODULE, AND FIBER STUB

(75) Inventors: Naoyuki Yamabayashi, Yokohama (JP); Hiromi Nakanishi, Osaka (JP); Yoshiki Kuhara, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 58 days.

(21) Appl. No.: 10/173,412

(22) Filed: Jun. 18, 2002

(65) Prior Publication Data

US 2002/0195611 A1 Dec. 26, 2002

(30) Foreign Application Priority Data

Jun. 26, 2001 (JP) ........................................ 2001-193108

(51) Int. Cl.$^7$ .............................. H01S 3/08; G02B 6/34; G02B 6/38
(52) U.S. Cl. .............................. 372/92; 385/37; 385/56; 385/70
(58) Field of Search .............................. 372/34, 36, 92; 385/37, 5–60, 70–72

(56) References Cited

U.S. PATENT DOCUMENTS

| | | | | |
|---|---|---|---|---|
| 5,647,042 A | * | 7/1997 | Ochiai et al. ................... | 385/56 |
| 5,650,856 A | * | 7/1997 | Morse ........................... | 356/436 |
| 5,812,716 A | * | 9/1998 | Ohishi ............................ | 385/92 |
| 5,892,582 A | * | 4/1999 | Bao et al. ....................... | 356/519 |
| 5,993,073 A | * | 11/1999 | Hamakawa et al. ........... | 385/88 |
| 6,115,122 A | * | 9/2000 | Bao et al. ....................... | 356/450 |
| 6,244,754 B1 | * | 6/2001 | Takagi et al. ................... | 385/88 |
| 6,282,351 B1 | * | 8/2001 | Go et al. ........................ | 385/92 |
| 6,310,997 B1 | * | 10/2001 | Kato et al. ..................... | 385/37 |
| 6,377,742 B1 | * | 4/2002 | Go .................................. | 385/134 |
| 6,415,078 B1 | * | 7/2002 | Shigehara et al. ............. | 385/37 |
| 6,435,734 B2 | * | 8/2002 | Okada et al. ................... | 385/88 |
| 6,530,698 B1 | * | 3/2003 | Kuhara et al. ................. | 385/88 |
| 6,563,970 B1 | * | 5/2003 | Bohnert et al. ................ | 385/13 |
| 6,567,590 B1 | * | 5/2003 | Okada et al. ................... | 385/49 |
| 2001/0021210 A1 | * | 9/2001 | Nakaya et al. ................. | 372/43 |
| 2002/0085596 A1 | * | 7/2002 | Irie et al. ........................ | 372/36 |
| 2002/0094146 A1 | * | 7/2002 | Yamaguchi ..................... | 385/2 |
| 2002/0122454 A1 | * | 9/2002 | Nasu et al. ..................... | 372/102 |

FOREIGN PATENT DOCUMENTS

| JP | 6-5961 | 1/1994 |
|---|---|---|
| JP | 2000-353845 | 12/2000 |
| WO | WO 94/22187 | 9/1994 |

OTHER PUBLICATIONS

Bird, et al., *Narrow Line Semiconductor Laser Using Fibre Grating*, Electronics Letters 20$^{th}$ Jun. 1991, vol. 27, No. 13, pp. 1115–1116 (Prior Art cited in the specification).

* cited by examiner

*Primary Examiner*—Minsun Oh Harvery
*Assistant Examiner*—Phillip Nguyen
(74) *Attorney, Agent, or Firm*—Smith, Gambrell & Russell, LLP

(57) ABSTRACT

The light-emitting device has a fiber stub part, a semiconductor optical amplifying device, a photodiode, and a bench as its main parts. The fiber stub part is composed of a ferrule and a grating fiber. The fiber stub part and the semiconductor optical amplifying device are mounted on the bench, and optically coupled together. An optical cavity is composed of the light-reflecting face of the semiconductor optical amplifying device and the diffraction grating of the grating fiber. The light-emitting device, which does not use a pigtail fiber, can be downsized and can provide laser light with a desired wavelength.

8 Claims, 13 Drawing Sheets

LIGHT-EMITTING DEVICE, OPTICAL MODULE, AND FIBER STUB

BACKGROUND OF THE INVENTION

1. Field of the Invention

The present invention relates to a light-emitting device, an optical module, and a fiber stub.

2. Description of Related Art

A light-emitting module is widely used for generating signal light to be input to an optical fiber that constitutes an optical transmission line in an optical communication system. The light-emitting module generally has a semiconductor laser device that generates a light signal and an optical system that includes a lens for directing the signal light to the optical fiber. A Fabry-Perot type semiconductor device or a DFB-type semiconductor laser device is used as the semiconductor laser device. Also, there is a light-emitting module in which an external cavity semiconductor laser system is used. In the external cavity semiconductor laser system, an optical cavity is composed of a semiconductor optical device and a Bragg grating.

The examples of a light-emitting device having an external cavity semiconductor laser system are described in Literature 1 ("Electronics Letters 20 Jun. 1991 vol.27 No.13, pp.1115–1116"), Literature 2 (Japanese Patent Application Publication Toku-kai-hei No. 6-5961), Literature 3 (WO 94/22187), and Literature 4 (Japanese Patent Application Publication No. 2000-353845), for example.

In particular, the light-emitting device described in Literature 1 is provided with a grating fiber part and a semiconductor optical device. The grating fiber part has an attachable/detachable connector through which it is connected to a package. With this composition, a light-emitting device for generating light with different wavelengths can be obtained easily. First, several kinds of grating fiber parts provided with diffraction gratings for different reflection wavelengths are prepared beforehand. A grating fiber part for a desired reflection wavelength is selected from them, and is attached to a package. Thus, the optical module emits light with the desired wavelength.

However, since the above-mentioned grating fiber part needs some length, it is often that the handling thereof is cumbersome. In particular, since a region for storing a grating fiber part is necessary, an optical transmitter device using such light-emitting device has a drawback that it is difficult to downsize. Also, according to the knowledge of the present inventor, a package of the type described in the above-mentioned literature is not preferable for downsizing an optical transmitter device because it tends to be large-sized. Moreover, there is a shortage that the productivity thereof is low in mass production, since a diffraction grating is formed one by one in each optical fiber having a given length.

Also, Literature 2 discloses an optical module in which an external cavity semiconductor laser system is used. In this optical module, a pigtail fiber extends in some length from the package of the optical module. When these light-emitting devices are mounted onto a circuit board, the pigtail fiber is rolled up and put on the circuit board. That is, it is necessary to provide the circuit board with a region on which the rolled pigtail fiber is put. In an optical communication system such as LAN (Local Area Network), for example, it is important to downsize a circuit board and it is preferable in such a field to decrease the above-mentioned region for disposing the pigtail fiber.

SUMMARY OF THE INVENTION

An object of the present invention is to provide a light-emitting device having a structure in which it is possible to reduce the region needed for the arrangement of a pigtail fiber when the light-emitting device is put on a circuit board. Another object of the present invention is to provide a fiber stub part for various reflection wavelengths that is suitable for mass production, and hence to provide a light-emitting device whose oscillation wavelengths are varied and which is suitable for mass production.

The light-emitting device according to the present invention is provided with (a) a fiber stub part comprising a grating fiber having one end, the other end and a diffraction grating, and a ferrule having one pair of end faces, (b) a semiconductor optical amplifying device having a light-reflecting face and a light-emitting face which is optically coupled to one end of the grating fiber, and (c) a bench having the first, second and third regions arranged along a given axis. The above-mentioned grating fiber has a first part and a second part that are provided between the one end and the other end thereof. The ferrule is arranged in the above-mentioned first part. Also, the other end of the grating fiber is exposed at one of one pair of end faces of the ferrule. The first region of the bench has a ferrule supporting part extending along a given axis to support the ferrule. The second region has an optical fiber supporting part extending along the given axis to support the grating fiber. The third region has a device supporting part on which a semiconductor optical amplifying device is mounted.

In the above-mentioned light-emitting device, the fiber stub part is composed of a ferrule and a grating fiber. The fiber stub part and the semiconductor optical amplifying device are mounted on the same bench. Therefore, an optical module is provided without using a pigtail fiber.

Also, in the light-emitting device according to the present invention, the bench has a positioning face provided intersecting a given axis between the above-mentioned second region and third region. One end of the grating fiber is in contact with the positioning face. Therefore, the fiber stub part is easily positioned. Since the bench can be formed with precision, the relative position of the positioning face and the semiconductor optical amplifying device is easily determined. Therefore, if the fiber stub part is positioned by the positioning face, the relative position of the fiber stub part and the semiconductor optical amplifying device is determined easily and precisely. Accordingly, the resonator length of the optical cavity can be securely and easily determined to a given value.

Moreover, in the light-emitting device of the present invention, it is preferable that the ferrule of the fiber stub part is disposed in the first part, and the diffraction grating is provided in the second part. The fiber stub part of this form has a structure such that a diffraction grating having a desired spectrum can be formed after assembling a ferrule and an optical fiber in which a diffraction grating is not formed.

Also, in the light-emitting device of the present invention, the fiber stub part may be such form as contains the ferrule and diffraction grating in the first part. With a fiber stub part having such structure, an external cavity semiconductor laser system also can be formed by optically coupling a fiber stub part and a semiconductor optical amplifying device together.

Preferably, the bench consists of ceramics. More preferably, the bench consists of silicon. If the bench is made of these materials, the composition of the bench, such as the first through third regions, the ferrule supporting part, the optical fiber supporting part, and the device supporting part, can be formed with precision.

The fiber stub part according to the present invention is provided with a grating fiber having one end, the other end and a diffraction grating, and a ferrule having one pair of end faces. The grating fiber has first and second parts between the one end and the other end, and the ferrule is provided in the first part, and the diffraction grating is provided in the second part, and the other end of the grating fiber is exposed at one of one pair of the end faces of the ferrule.

Also, the fiber stub part according to the present invention has a ferrule having one pair of end faces and a grating fiber having one end, the other end, and a diffraction grating. The grating fiber has first and second parts between the one end and the other end, and the ferrule and the diffraction grating are provided in the first part. The other end of the grating fiber is exposed at one of one pair of end faces of the ferrule.

An optical module according to the present invention is provided with the above-mentioned light-emitting device and a housing that accommodates the light-emitting device. A first end face of the ferrule is located outside the housing, and the above-mentioned optical device is placed in the housing. Thus, the optical module and an outside optical fiber to be connected to the optical module are optically coupled together securely.

The optical module according to the present invention is provided with the above-mentioned light-emitting device, a lead frame on which the light-emitting device is mounted and which has a plurality of lead terminals, and a resin body which seals the light-emitting device and the lead frame such that the first end face of the ferrule is located outside and the above-mentioned plurality of lead terminals protrude outside. Therefore, electric signals output from an outside circuit can be easily and securely led to the optical module.

As described above, the light-emitting device of the present invention has a structure in which it is possible to reduce the region which otherwise is needed for the arrangement of the pigtail fiber when it is mounted on a circuit board. Also, the light-emitting device and the optical module according to the present invention allow an improved mass productivity of fiber stub parts having various Bragg reflection wavelengths, and the mass productivity of the light-emitting device for various oscillation wavelengths is also improved.

EXPLANATION OF NUMERICAL MARKS

Figure 1:
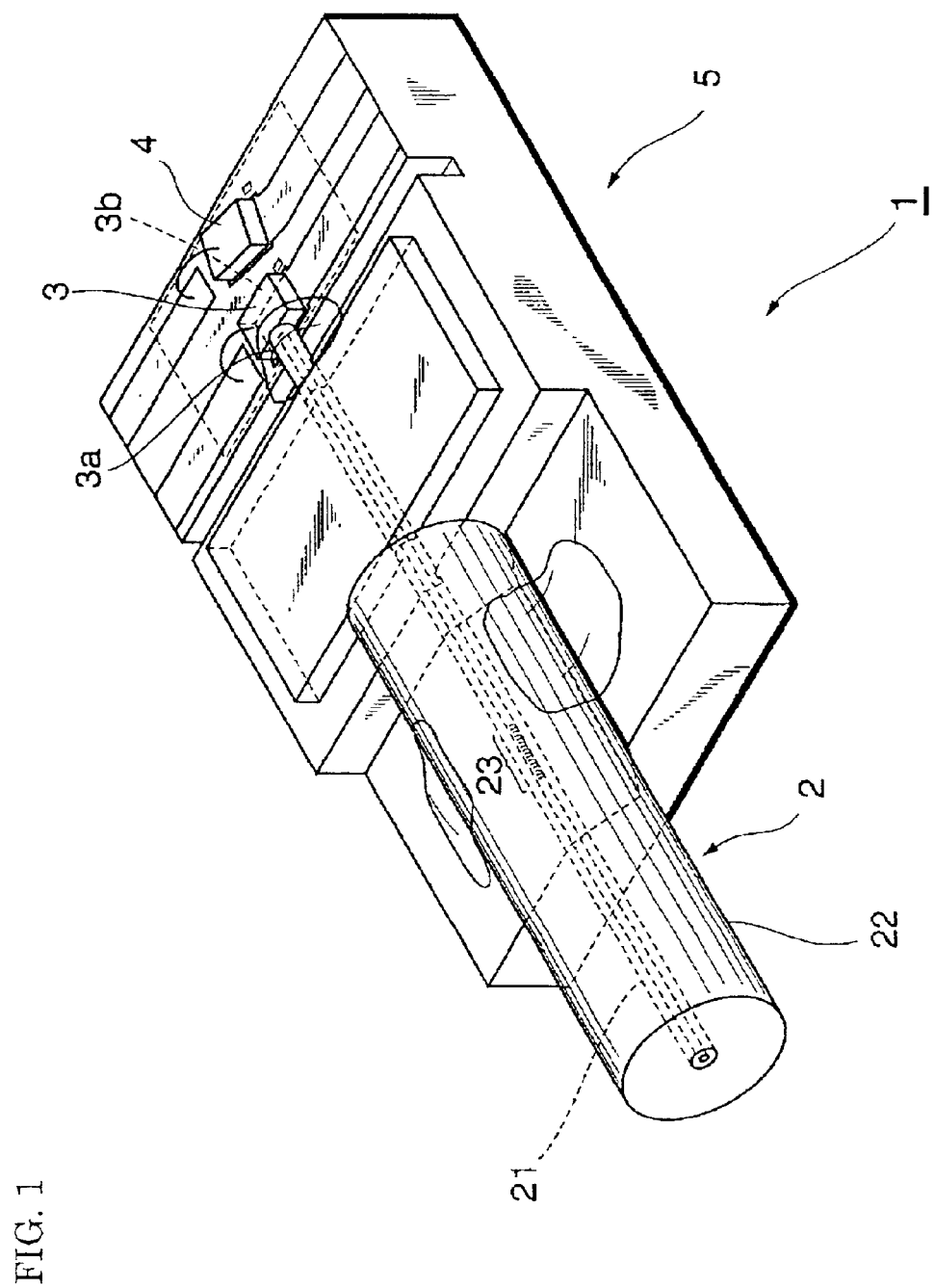
FIG. 1 is a perspective view showing the composition of a light-emitting device according to the first embodiment.

1 . . . light-emitting device, 2 . . . fiber stub part, 3 . . . semiconductor optical amplifying device, 3a . . . light-emitting face, 3b . . . light-reflecting face, 4 . . . photodiode, 5 . . . bench, 5a, 5b, and 5c . . . region, 10 . . . optical module, 10 . . . optical module, 21 . . . grating fiber, 22 . . . ferrule, 23 . . . diffraction grating, 25 . . . fixing member, 30 . . . lead frame part, 31 . . . die-pad, 32 . . . leads, 33 . . . outer frame, 35 . . . resin body, 36 . . . coupling portion, 51 . . . ferrule supporting part, 52 . . . optical fiber supporting part , 53 . . . trench, 54 . . . device mounting part, 54s and 54t . . . positioning mark, 54a–54d . . . wiring, 100 . . . multi-wavelength optical communication system, 70 . . . optical fiber , 72 . . . coupling portion, 73 . . . optical connector, 111 . . . optical transmitter device, 120 . . . optical multiplexer, 130 . . . optical demultiplexer, 141 . . . optical receiver device, 150 . . . optical transmission line

DETAILED DESCRIPTION OF THE INVENTION

In reference to the drawings, an explanation is given below about embodiments of the light-emitting device according to the present invention. The same reference numeral marks denote the same parts, where possible, throughout the drawings, and a repeated explanation will be omitted.

(First Embodiment)

FIG. 1 is a perspective view showing the composition of a light-emitting device according to the first embodiment.

With reference to FIG. 1, the light-emitting device 1 has a fiber stub part 2, a semiconductor optical amplifying device 3, a photodiode 4, and a bench 5, as its essential parts. The fiber stub part 2 is optically coupled to the semiconductor optical amplifying device 3. The photodiode 4 is also optically coupled to the semiconductor optical amplifying device 3.

Figure 2:
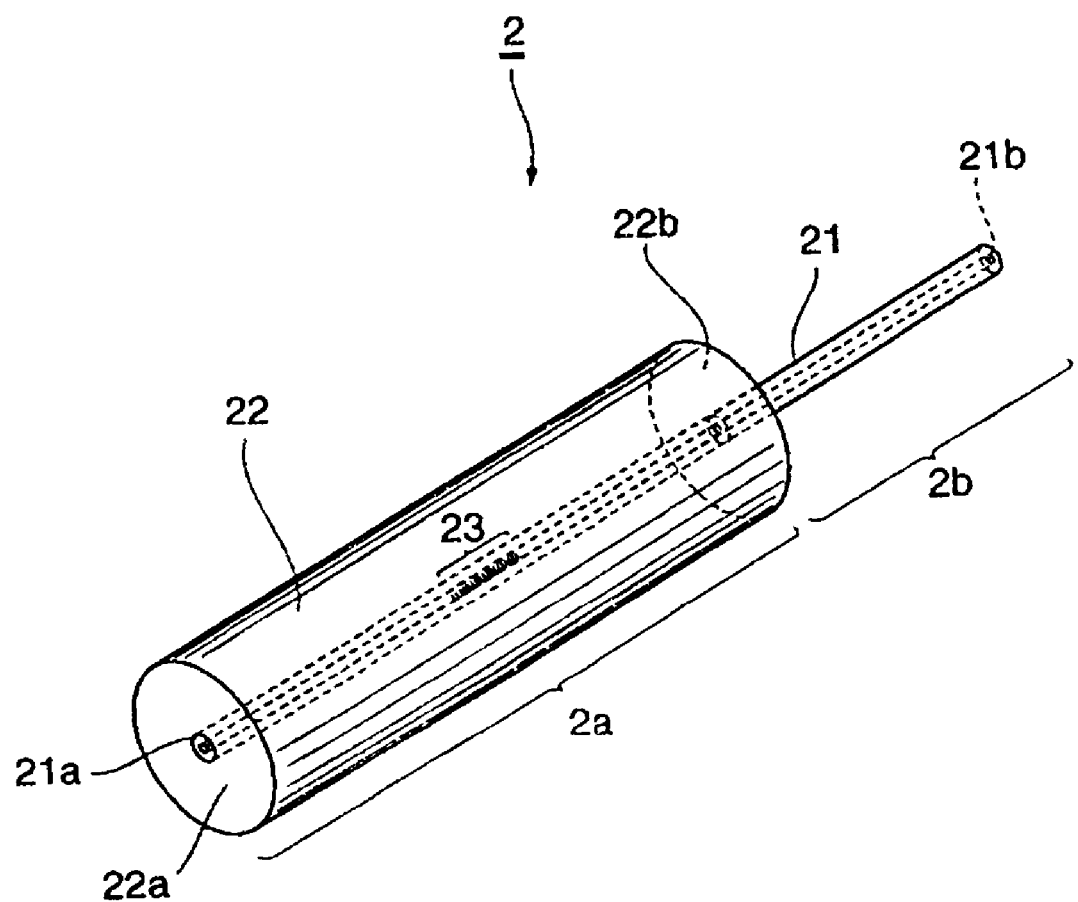
FIG. 2 is a perspective view showing the composition of a fiber stub part.

First, an explanation of the fiber stub part 2 is given in reference to FIG. 2. The fiber stub part 2 has a grating fiber 21 and a ferrule 22. The length of the grating fiber 21 is longitudinally about 8–11 mm, for example. The outer diameter of the grating fiber 21 is about 125 $\mu$m, and the core diameter is about 10 $\mu$m, for example. The ferrule 22 is a pipe-shaped member extending along a given axis, and can be made of a ceramic material such as zirconia, or plastic material. The grating fiber 21 is inserted into the ferrule 22 along the given axis. The length of the ferrule 22 is about 5–7 mm along the given axis, for example.

Referring to FIG. 2, the fiber stub part 2 has a first part 2a and a second part 2b. In the first part 2a, the longitudinal side surface of the grating fiber 21 is covered with the ferrule 22. In the second part 2b, the grating fiber 21 is exposed, without being covered with the ferrule. Also, an end face 21a of the grating fiber 21 is exposed at an end face 22a of the ferrule 22. Therefore, the optical coupling of the end face 21a of the grating fiber 21 to an outside optical fiber on which signal light emitted from the light-emitting device 1 is incident can be achieved easily.

Preferably, an end face 21b of the grating fiber 21 inclines to the optical axis of the grating fiber at an angle in the range of 82° to 86°. The end face 21b is optically coupled to the semiconductor optical amplifying device 3 as described later. In this case, if the end face which is optically coupled to the semiconductor optical amplifying device is at 90° to the optical axis of the grating fiber, light which is emitted from the semiconductor optical amplifying device is reflected at the end face, and the reflected light returns to the semiconductor optical amplifying device. Consequently, the semiconductor optical amplifying device may be subject to phenomena such as a decrease in the intensity of emitted light or occurrence of optical noise, for example. In the present embodiment, however, since the end face 21b of the grating fiber 21 is slanted relative to the optical axis of the grating fiber 21, it is possible to prevent the light reflected at the end face 21b from being incident on the semiconductor optical amplifying device 3. Therefore, the occurrence of the above-mentioned phenomena is restrained. Also, the angle formed between the end face 21b and the optical axis may be 90° at the time of cutting if an anti-reflection film is provided at the end face 21b. This can reduce the reflection of light at the end face 21b, whereby the reflection of the light to the semiconductor optical amplifying device 3 can also be decreased.

Figure 3A:
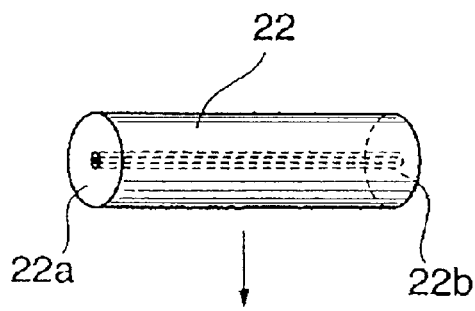
FIGS. 3(a)–(f) illustrate a preparation method of a fiber stub part according to one embodiment of the present invention.
Figure 3B:
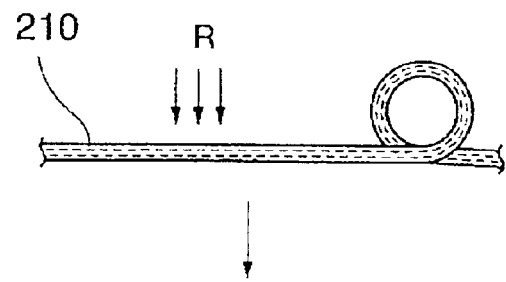

The fiber stub part 2 having the above-mentioned composition can be prepared in the following manner, for example. The preparation method is explained, referring to FIGS. 3(a)–(f). First, a ferrule 22 extending along a given axis is prepared (FIG. 3(a)). This ferrule 22 can be prepared by forming ceramics such as zirconia into a pipe-shape. The length along the direction of the central axis of the ferrule 22 may be about 5–7 mm. Also, the ferrule 22 has a through-hole provided along the central axis. The diameter of the through-hole is suitably chosen according to the outer diameter of the grating fiber 21 to be inserted in the through-hole.

The grating fiber 21 is made from a silica glass optical fiber 210 whose core region is doped with $GeO_2$. A diffraction grating 23 is formed by irradiating ultraviolet light R whose intensity changes spatially to the optical fiber 210 (FIG. 3(b)). Typically, the pitch of the diffraction grating 23 may be about 0.53 µm, and the overall length of the diffraction grating 23 can be not less than 1.5 mm and not more than 2.0 mm. The reflection wavelength of the diffraction grating 23 having the above-mentioned pitch can become a wavelength band such as the 1550 nm band, for example. After forming the diffraction grating 23, the optical fiber 210 is cut into a predetermined length to obtain an optical fiber 211 in which the diffraction grating 23 is provided (FIG. 3(c)). Here, the predetermined length is approximately equal to the length that the grating fiber 21 should have after the completion of the fiber stub part 2.

The diffraction grating can be formed at a plurality of positions of the optical fiber. Particularly, the diffraction grating can be produced at a short time by repeating the work in order in which after the irradiation of ultraviolet light, the optical fiber is moved longitudinally by a given distance, and the irradiation of ultraviolet light is done again. Various kinds of diffraction gratings having different pitch or length may be formed. If the diffraction gratings having various reflection spectra are prepared in this manner, it is possible to produce a light-emitting device that can emit light with various wavelengths.

Figure 3D:
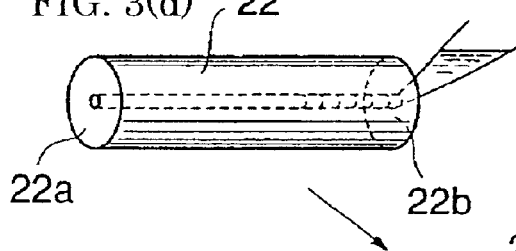
Figure 3C:
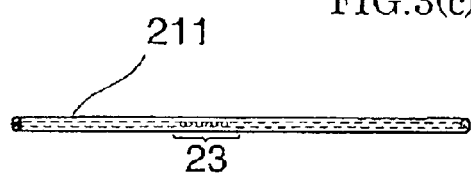
Figure 3E:
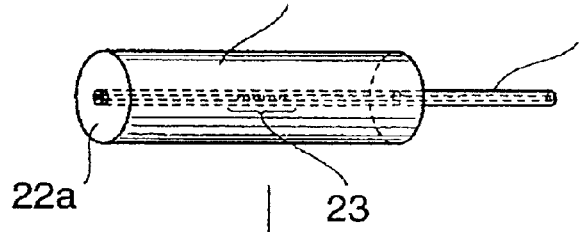

Next, a given thermosetting adhesive is poured into the through-hole of ferrule 22 (FIG. 3(d)), and the optical fiber 211 is inserted into the through-hole of the ferrule 22 (FIG. 3(e)). Preferably, the end of the optical fiber 211 is protruded about 0.5 mm from the end face 22a of the ferrule 22. The optical fiber 211 extends from 22b of the end face of the ferrule 22. After that, the adhesive is hardened by heating the ferrule 22 to a given temperature. Next, the end face 22a of the ferrule 22 is polished. In the case of this polish, the end of the optical fiber 211 protruding out of the through-hole of the ferrule 22 is also polished. As a result of this polish, the end face 21a of the grating fiber 21 becomes at approximately the same position with, or slightly protruded from, the end face 22a of the ferrule 22. In other words, in the fiber stub part 2, the end face 21a of the grating fiber 21 becomes exposed at the end face 22a of the ferrule 22. Thus, the end face 21a of the grating fiber 21 and an outside optical fiber on which light from the light-emitting device 1 is to be incident can be securely contacted. Preferably, the end face 21a is in a form of a lens. This enables the end face 21a to contact the outside optical fiber more securely.

Figure 3F:
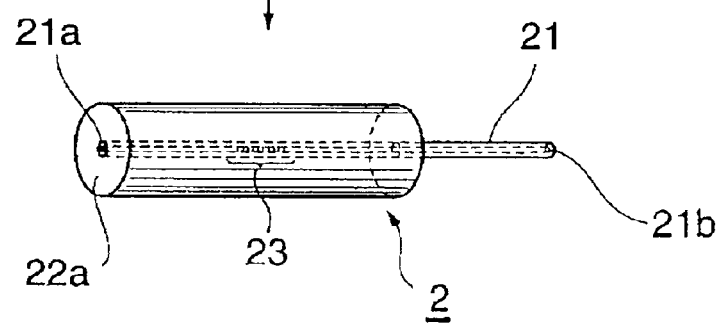

After the above-mentioned polish, the grating fiber 21 is cut such that the part of the grating fiber 21 extending from the end face 22b of the ferrule 22 is 2–4 mm in length, for example (FIG. 3(f)). In this case, as described above, the end face 21b of the grating fiber 21 is inclined at an angle in the range of 82° to 86° to the optical axis of the grating fiber 21. Thus, the fiber stub part 2 which consists of the ferrule 22 and the grating fiber 21 is completed.

Figure 4A:
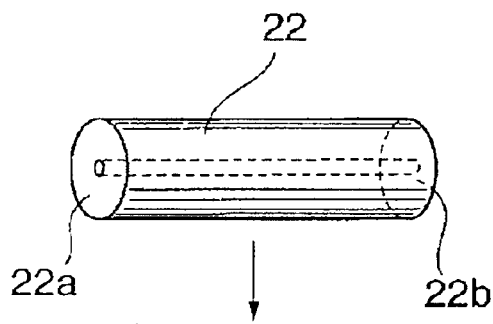
FIGS. 4(a)–(f) illustrate a preparation method of a fiber stub part according to another embodiment of the present invention.
Figure 4B:
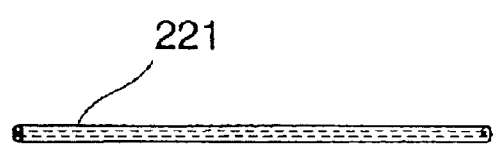
Figure 4C:
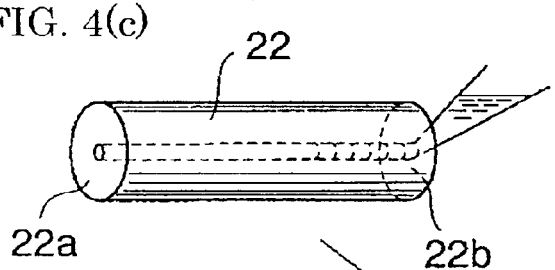
Figure 4D:
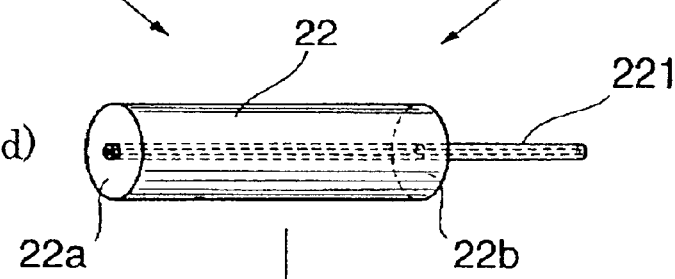
Figure 4E:
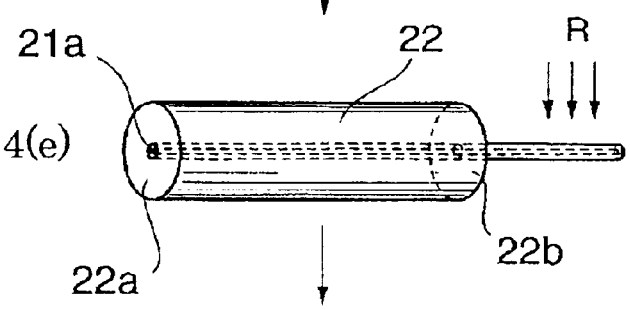
Figure 4F:
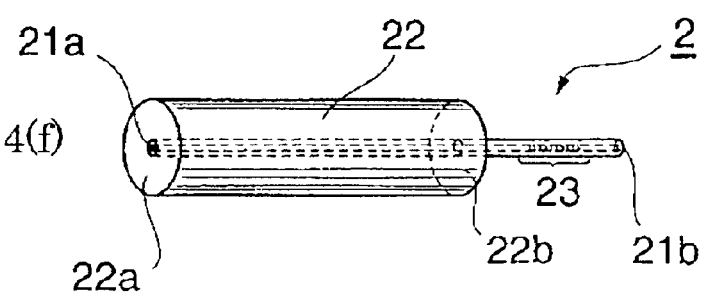

Also, the fiber stub part 2 may be prepared such that the diffraction grating 23 is provided at the second part 2b (the exposed part of the grating fiber 21). In this case, the fiber stub part 2 can be prepared as follows. This preparation method is explained in reference to FIGS. 4(a)–(i). First, the ferrule 22 is prepared (FIG. 4(a)). Next, a silica glass optical fiber whose core region is doped with $GeO_2$ is cut to obtain a given length of an optical fiber 221 (FIG. 4(a)). Here, the given length is a length which the grating fiber 21 should have after the completion of the fiber stub part 2, including a cutting margin and a polish margin. Next, an adhesive is poured into the through-hole of the ferrule 22 (FIG. 4(c)), and the optical fiber 221 is inserted into the through-hole of the ferrule 22. Here, the end of optical fiber 221 protrudes from the end face 22a of the ferrule 22 by about 0.5 mm. Subsequently, the optical fiber 221 and the ferrule 22 are fixed together by hardening the adhesive (FIG. 4(d)). After that, the end face 22a of the ferrule 22 is polished. Then, the diffraction grating 23 is formed by irradiating ultraviolet light R to the extending portion of the optical fiber 221 (FIG. 4(e)). Lastly, the optical fiber 221 having the diffraction grating 23 is cut to a length that the grating fiber 21 should have so that the fiber stub part 2 is completed (FIG. 4(f)). The length of the grating fiber 21 is determined by managing the manufacturing conditions such that the length between the diffraction grating 23 and the light-reflecting face of the semiconductor optical amplifying device 3 becomes a given value, that is, the optical cavity length has a given value.

The fiber stub part 2 of this form has the following advantages. If a great number of members 222 that are formed by fixing the optical fiber 221 and the ferrule 22 together are juxtaposed and irradiated with ultraviolet light at a time, the fiber stub part 2 can be efficiently prepared. Also, the fiber stub parts 2 having a pre-determined reflection wavelength can be prepared easily according to the need if a large number of members 222 are prepared beforehand and diffraction gratings having the desired reflection spectra are formed in the members 222. Thus, the light-emitting device that emits light having a given wavelength can be provided as needed.

Next, the semiconductor optical amplifying device 3 is explained. The semiconductor optical amplifying device 3 has a multi quantum well (MQW) structure in which the activated layer is InGaAsP prepared on an InP substrate, and emits light with a wavelength of about 1550 nm, for example. The size of such semiconductor optical amplifying device 3 can be 300 μm in length, 300 μm in width and 120 μm in height. Also, the semiconductor optical amplifying device 3 has a light-emitting face 3a and a light-reflecting face 3b as shown in FIG. 1. The light-emitting face 3a is opposite to the light-reflecting face 3b. An anti-reflection film is provided for forming the light-emitting face 3a such that the reflectivity becomes equal to or less than 0.5%, or preferably as low as equal to or less than 0.1%. Thus, it is possible to reduce the reflectivity at the light-emitting face 3a. The light-reflecting face 3b of the semiconductor optical amplifying device 3 has a reflection film with a reflectivity in the range of 30% to 95% or, more preferably, in the range from 60% to 80%. These anti-reflection and reflection films can be made of multilayered dielectric films with a stack of dielectrics such as $SiO_2$, $TiO_2$, SiN, $Al_2O_3$ and $MgF_2$. The above-mentioned anti-reflection and reflection film can be obtained by selecting an appropriate material and film thickness of each dielectric film.

As for the photodiode 4, an end face incidence-type photodiode having InGaAsP as a light-receiving part can be used, for example. The photodiode 4 may be 450 μm in length, 450 μm in width and 200 μm in height, for example. The photodiode 4 is disposed opposite to the light-reflecting face 3b of the semiconductor optical amplifying device 3 such that the light-receiving face is optically coupled thereto. Therefore, the photodiode 4 operates as a photodiode for the monitor to detect the intensity of the emitted light of the semiconductor optical amplifying device 3. Also, the light-receiving face of the photodiode 4 is arranged such that it inclines at a given angle to the light-reflecting face 3b of the semiconductor optical amplifying device 3. With this arrangement, it is possible to prevent light reflected at the photodiode 4 from returning to the semiconductor optical amplifying device 3.

Figure 5:
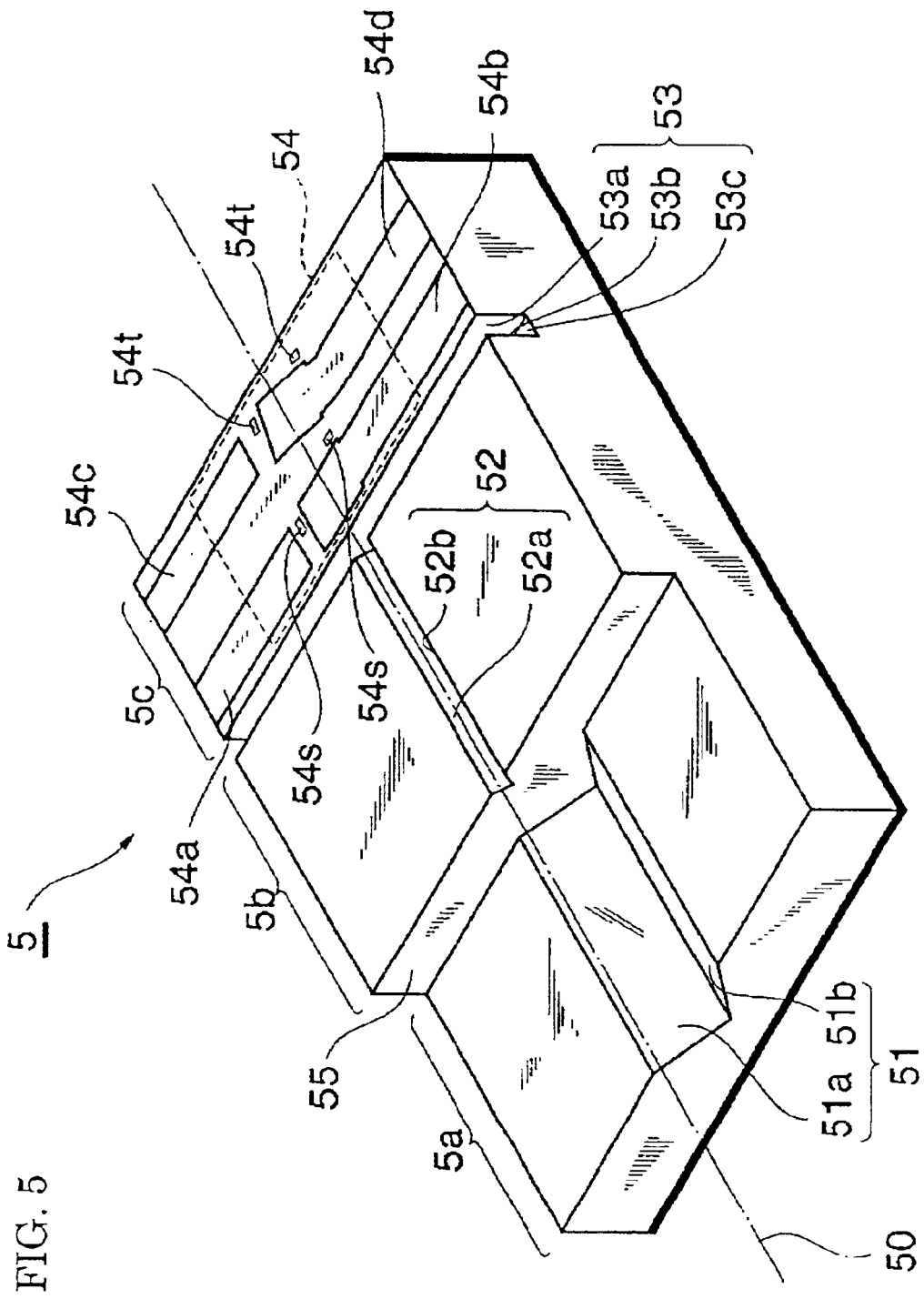
FIG. 5 is a perspective view showing the composition of a bench of a light-emitting device.

Next, the bench 5 is explained in reference to FIG. 5. The bench 5 is preferably made of silicon (Si) or ceramics, for example. The bench 5 may be about 7 mm in length, about 3 mm in width, and about 1.2 mm in height, for example. The bench 5 is provided with a first region 5a, second region 5b and third region 5c along a given axis 50. There is provided a difference in level at the boundary between the first region 5a and the second region 5b and this difference forms a sidewall 55 that faces the first region 5a. A ferrule supporting part 51 extending along the given axis 50 is provided at the first region 5a. The ferrule supporting part 51 has two supporting surfaces 51a and 51b. The cross-section formed by these supporting faces 51a and 51b in a direction perpendicular to the extending direction of the ferrule supporting part 51 is substantially V-shape. As shown in FIG. 1, these support surfaces 51a and 51b support the first part 2a of the fiber stub part 2, that is, the circumferential side of the ferrule 22.

An optical fiber supporting part 52 extending along the given axis 50 is provided at the second region 5b of the bench 5. The optical fiber supporting part 52 has two supporting faces 52a and 52b. The cross-section formed with the supporting faces 52a and 52b in a direction perpendicular to the extending direction of the optical fiber supporting part 52 is substantially V-shaped. As shown in FIG. 1, these supporting faces 52a and 52b support the second part 2b of the fiber stub part 2, that is, the exposed part of the grating fiber 21. The ferrule supporting part 51 and the optical fiber supporting part 52 are continuous together along the given axis 50.

Moreover, the bench 5 is provided with a trench 53 so as to separate the second region 5b and the third region 5c of the bench 5. The trench 53 extends in a direction perpendicular to the given axis 50. Also, the cross-section of the trench 53 is a rectangle formed by two sidewalls 53a and 53b and a bottom 53c. Also, the trench 53 is formed deeper than the optical fiber supporting part 52.

The third region 5c of the bench 5 has a device mounting part 54, on which the semiconductor optical amplifying device 3 and the photodiode 4 are mounted. The device mounting part 54 has wirings 54a and 54b for supplying the semiconductor optical amplifying device 3 with a drive signal. Also, the device mounting part 54 has wirings 54c and 54d for taking out an output signal from the photodiode 4. Moreover, the device mounting part 54 has a positioning mark 54s for determining the mounting position of the semiconductor optical amplifying device 3 and a positioning mark 54t for determining the mounting position of the photodiode 4.

Preferably, the bench 5 is prepared using a silicon substrate whose main plane is (100). If such silicon substrate is used, the above-mentioned ferrule supporting part 51, the optical fiber 52 and the trench 53 are formed easily and precisely by forming a mask pattern by photolithography and performing etching. It is preferable to use an etching solution having anisotropy for etching rate such as a KOH solution, for example. If such an etching solution is used and the direction of the above-mentioned axis 50 is coincided with a given crystal orientation, the supporting faces 51a and 51b, and 52a, 52b can be formed with a plane (111) which is slow in the speed of etching by a KOH solution or a crystal plane which is equivalent to the plane (111). That is, the trench having a V-shaped cross-section can be formed for the ferrule supporting part 51 and the optical fiber supporting part 52. Here, by changing the etching time and the opening width of the mask pattern appropriately, the ferrule supporting part 51 and the optical fiber supporting part 52 can be formed with different widths, respectively as shown in FIG. 5. Also, a trench as the trench 53 having a rectangular cross-section along the direction of [100] can be formed by dicing. When the bench 5 is made of a silicon substrate having a main plane of (100), it is unnecessary to provide a difference in level at the boundary between the first region 5a and the second region 5b. If there is no such difference in level, it is possible to make the positional precision of the ferrule supporting part 51 and the optical fiber supporting part 52 higher since a given resist film can be applied uniformly at photolithography. Also, without difference in level, the ferrule supporting part 51 must be formed deeper as compared with the case in which a difference in level is provided. When the ferrule supporting part 51 is formed deeper, the cross-section of the ferrule supporting part 51 can be formed into a substantially trapezoidal shape.

Also, pre-determined positioning marks 54s and 54t of the semiconductor optical amplifying device 3 and the photodiode 4 can be formed simultaneously with the ferrule supporting part 51, the optical fiber supporting part 52 and the trench 53. Therefore, a high precision of the relative positions among these supporting parts 51 and 52, the trench 53, and the positioning marks 54s and 54t can be achieved. The wirings 54a through 54d can be formed by using a given metallic film deposition method such as photolithography and vapor deposition or sputtering.

Figure 6A:
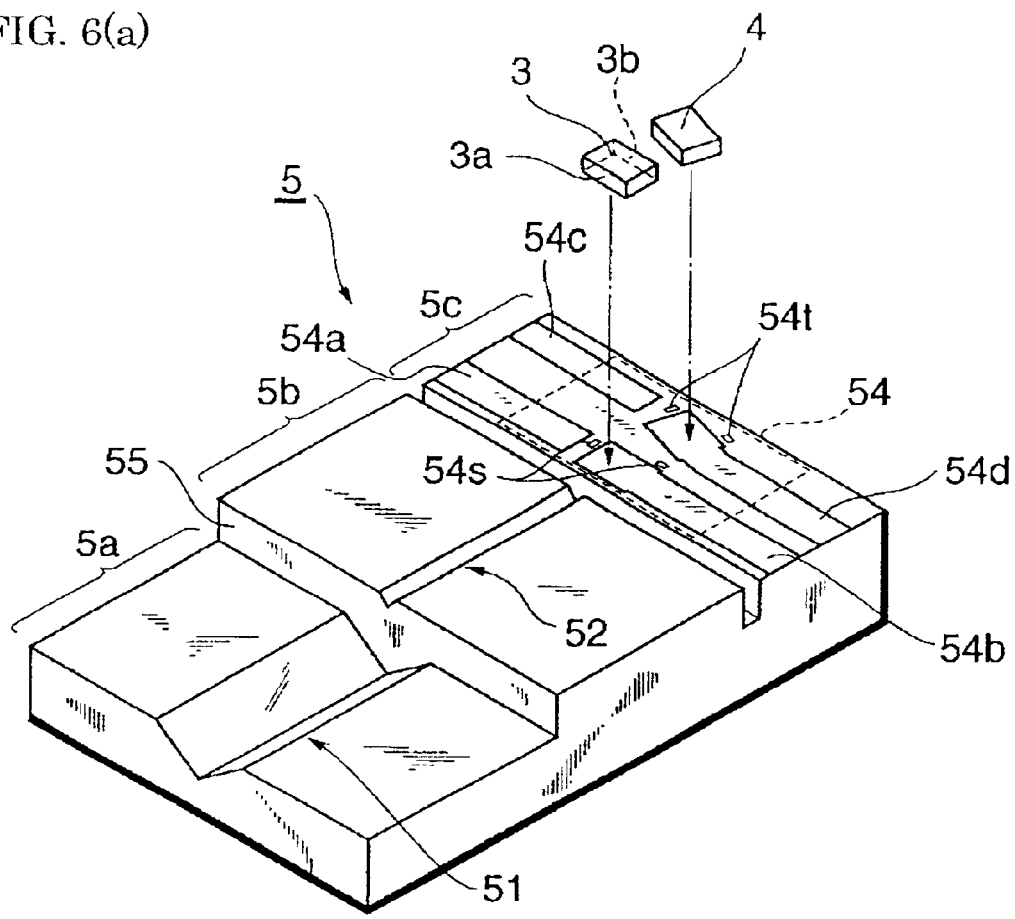
FIGS. 6(a) and (b) illustrate a process for fixing a semiconductor optical amplifying device and a photodiode (PD) on the bench.
Figure 6B:
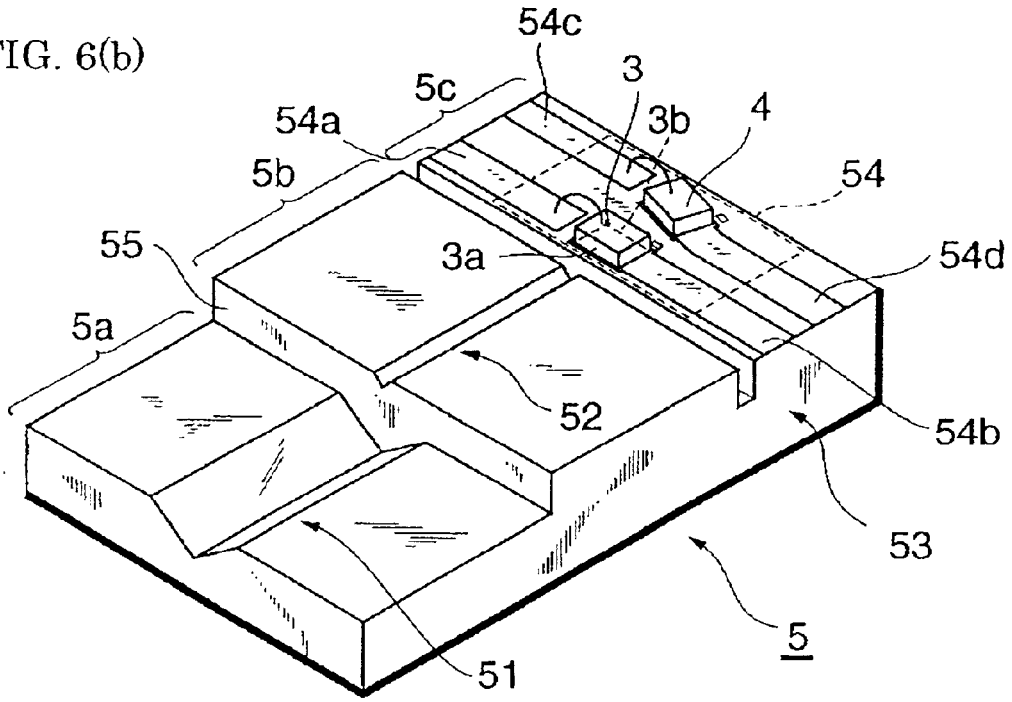

FIGS. 6(a) and (b) illustrate the process for fixing the semiconductor optical amplifying device 3 and the photodiode 4 on the bench 5. The semiconductor optical amplifying device 3 is automatically bonded onto the device mounting part 54 after the adjustment in position is done by the positioning mark 54s and image-recognition (FIG. 6(a)). In automatic bonding, the back electrode of the semiconductor optical amplifying device 3 and the wiring 54b are electrically coupled together using a solder such as AuSn and SnPb. After that, the surface electrode of semiconductor optical amplifying device 3 and the wiring 54a are coupled together by a bonding wire such as a gold wire (FIG. 6(b)). Thus, the semiconductor optical amplifying device 3 is mounted on the device mounting part 54. Also, a similar process is implemented for the photodiode 4 simultaneously with the semiconductor optical amplifying device 3, whereby the photodiode 4 is mounted onto the device mounting part 54.

Figure 7A:
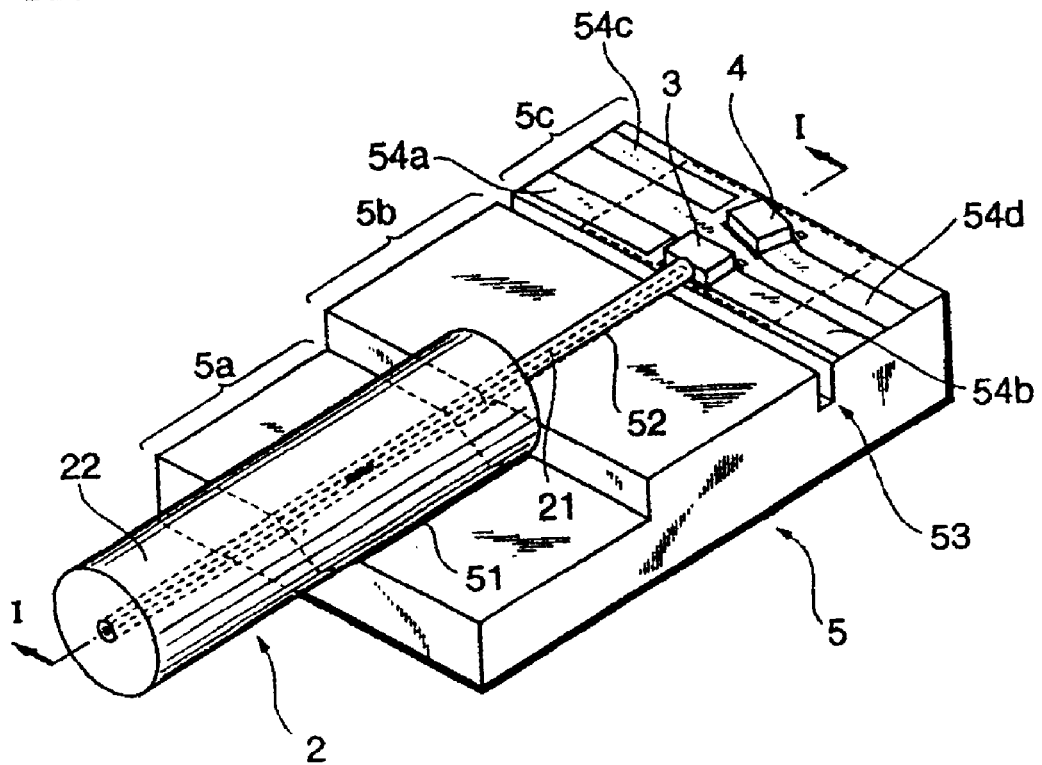
FIG. 7(a) illustrates a process for fixing a fiber stub part on the bench.
Figure 7B:
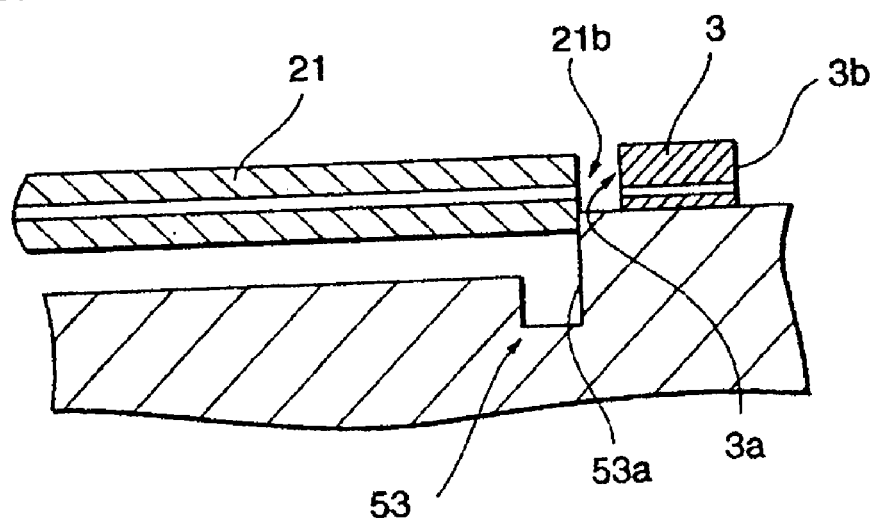
FIG. 7(b) shows an essential part in the section taken along lines I—I of FIG. 7(a).
Figure 8A:
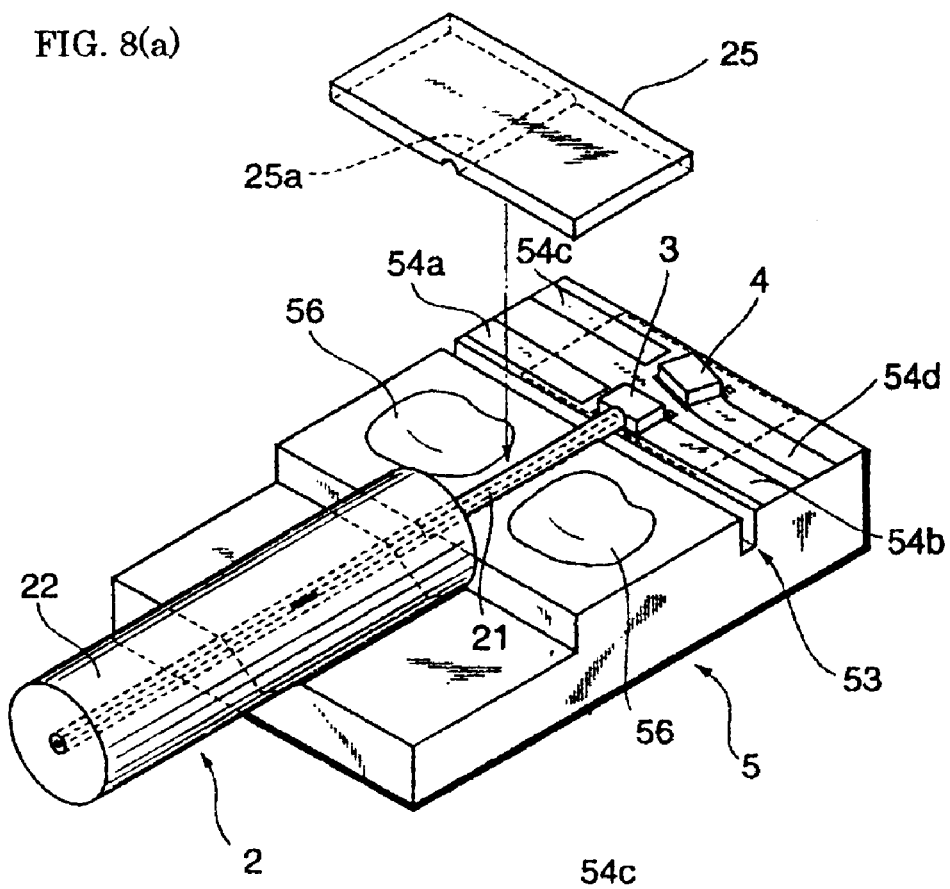
FIGS. 8(a) and (b) illustrate a process for fixing a fiber stub part on the bench.

FIGS. 7(a) and (b) and FIGS. 8(a) and (b) illustrate the processes for fixing the fiber stub part 2 on the bench 5. The fiber stub part 2 is mounted as shown in FIG. 7(a). As a result, the ferrule 22 of the fiber stub part 2 is supported by the ferrule supporting part 51 and the exposed grating fiber 21 is supported by the optical fiber supporting part 52. FIG. 7(b) illustrates a main part of the cross-section taken along lines I—I of FIG. 7(a). The grating fiber 21 is mounted in a manner in which the end face 21b is in contact with the sidewall 53a of the trench 53. In other words, the sidewall 53a is used as the positioning face of the fiber stub part 2. Thus, the distance between the diffraction grating 23 of the fiber stub part 2 and the light-reflecting face 3b of the semiconductor optical amplifying device 3, that is, a resonator length is determined. The distance between the end face 22b of the grating fiber 21 and the semiconductor optical amplifying device becomes about 20–70 μm, for example. Also, the length of the optical fiber supporting part 52 extending along the given axis 50 is shorter than the length in the same direction of the second part 2b (the exposed part of the grating fiber 21) of the fiber stub part 2.

With reference to FIG. 8(a), the process for fixing a grating fiber will be explained. A UV-hardening resin 56 is applied as an adhesive to the second region of the bench 5 except for the optical fiber supporting part 52, and the grating fiber 21 is covered with a fixing member 25. Subsequently, the UV-hardening resin 56 is hardened by irradiating ultraviolet light thereto, whereby the fixing member 25 is fixed to the bench 5. Thus, the grating fiber 21 of the fiber stub part 2 is fixed. The fixing member 25 consists of a material that is transmissive to ultraviolet light, and is made of silica glass, for example. Preferably, the fixing member 25 is provided with a groove 25a that accommodates the grating fiber 21. Thereby, the grating fiber 21 is fixed securely.

Figure 8B:
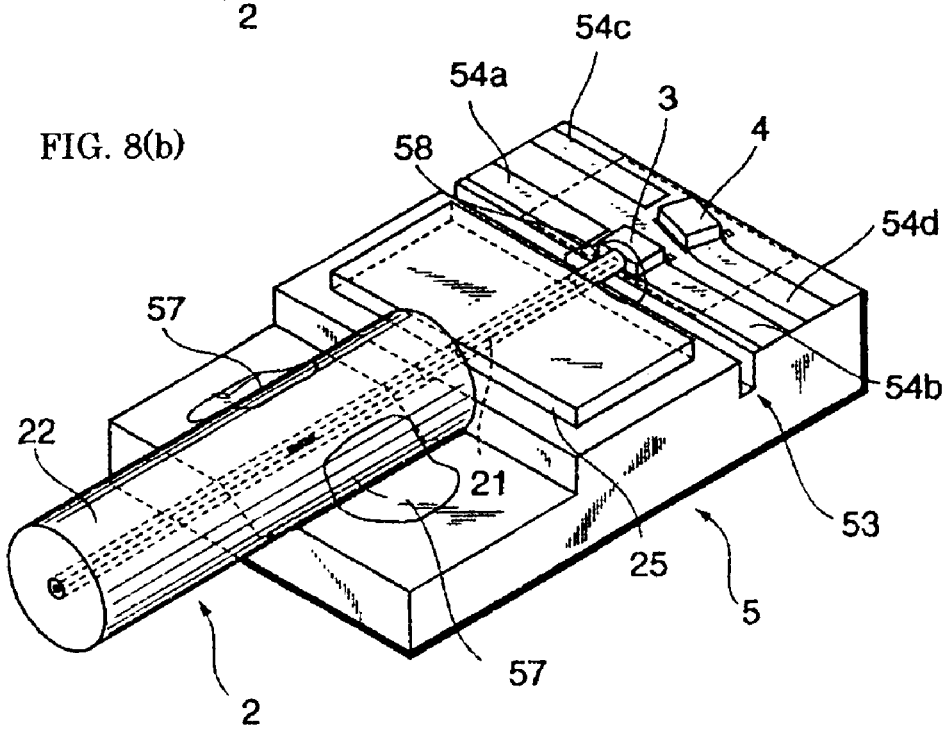

Subsequently, the UV hardening resin 57 is applied to the ferrule 22 of the fiber stub part 2 and the first region of the bench 5 as shown in FIG. 8(b). After this, ultraviolet light is irradiated to the UV hardening resin so as to harden the resin. Thus, the ferrule 22 of the fiber stub part 2 is fixed to the bench 5. Furthermore, a light transmissive resin 58, for example, silicone resin is applied as a protective material between the end face 21b of the grating fiber 21 and the semiconductor optical amplifying device 3. The light transmissive resin 58 should have a refractive index that does not hinder the light, which is to go back and forth between them, from entering into the semiconductor optical amplifying device 3 and the grating fiber 21. With the above-described processes, the light-emitting device 1 of the first embodiment is completed.

The light-emitting device 1 works as follows. In the light-emitting device 1, when an electric current which contains a given signal is allowed to flow in the semiconductor optical amplifying device 3 through the wirings 54a and 54b, light is emitted from the light-emitting face 3a. This light penetrates through the end face 21b of the fiber stub part 2 and enters into the fiber stub part 2. Then, the laser oscillation occurs between the diffraction grating 23 provided in the fiber stub part 2 and the light-reflecting face 3b of the semiconductor optical amplifying device 3. The laser light caused by the laser oscillation pass through the fiber grating 21 and is discharged from the end face 21a to outside. Then, when an outside optical fiber is provided so as to be optically coupled to the fiber stub part 2, the laser light is introduced into the optical fiber.

As described above, in the light-emitting device 1, the fiber stub part 2 is used, and an optical cavity is formed by the light-reflecting face 3b of the semiconductor optical amplifying device 3 and the diffraction grating 23 provided in the fiber stub part 2. The fiber stub part 2 is small as compared with a pigtail fiber, and moreover the second part 2b (the exposed part of the grating fiber 21) of the fiber stub part 2 is disposed on the bench 5. Therefore, the light-emitting device 1 can be downsized more easily as compared with the light-emitting device having a pigtail fiber.

Also, the diffraction grating 23 provided in the fiber stub part 2 can be prepared more easily and efficiently in large quantities by irradiating ultraviolet light to optical fibers. The fiber stub part 2 can also be produced easily at high mass productivity, since the fiber stub part 2 is prepared by polishing the end face 22a of the ferrule 22 after the grating fiber 21 having a diffraction grating 23 is inserted into the through-hole of the ferrule 22.

Also, the manufacturing process can be simplified because image-recognition and automatic bonding can be adopted for the mounting work since the fiber stub part 2, the semiconductor optical amplifying device 3, and the photodiode 4 are mounted on a single surface of the bench 5.

Moreover, the ferrule supporting part 51, the optical fiber supporting part 52, the trench 53, the positioning marks 54s and 54t, and the wirings 54a–54d are formed on the bench 5 with high precision. Therefore, the fiber stub part 2, the semiconductor optical amplifying device 3, and the photodiode 4 can be also mounted on the bench 5 in their relative positions with high precision. In other words, at the time of mounting them, there is no need to perform a process such as the adjustment of an optical axis, and consequently, the manufacturing process can be simplified.

Furthermore, in the light-emitting device 1, the optical coupling between the fiber stub part 2 and the semiconductor optical amplifying device 3 can be achieved without using a collecting lens, since the interval between them can be set to about 20–70 μm. Therefore, the cost and the process for the collecting lens can be eliminated. For example, it is possible to eliminate a process for welding a cap to a given bench, which is needed after a process of adjusting an optical axis in the case of mounting a collecting lens with a part such as a metal cap. However, in the case of manufacturing the optical device 1, neither the process of adjusting an optical axis nor the welding process is needed.

Moreover, the light-emitting device 1 has the following advantage as compared with a conventional light-emitting device using a Fabry-Perot type semiconductor device or a DFB-type semiconductor laser device. In the conventional light-emitting device, if the temperature of these semiconductor laser devices changes due to the variation of the driving conditions, the length of the optical cavity which is provided in a semiconductor laser device changes, which results in the variation of the wavelength of the light emitted from the light-emitting device. Therefore, a temperature control unit was used for stabilizing the temperature of the semiconductor laser device. However, in a light-emitting device according to the first embodiment, since an optical cavity is comprised of a diffraction grating formed in a grating fiber and the light-reflecting face of a semiconductor optical amplifying device, the grating fiber is seldom affected by the temperature variation of the semiconductor optical amplifying device. Therefore, in the light-emitting device 1, the oscillation wavelength variation due to a temperature variation can be reduced.

(Second Embodiment)

The above-described light-emitting device 1 in the first embodiment can be used in a manner such as it is mounted on a circuit board, for example. It is also used for an optical module in which it is housed in a package. For the second embodiment, such optical module in which the light-emitting device 1 according to the first embodiment is used is described.

Figure 9:
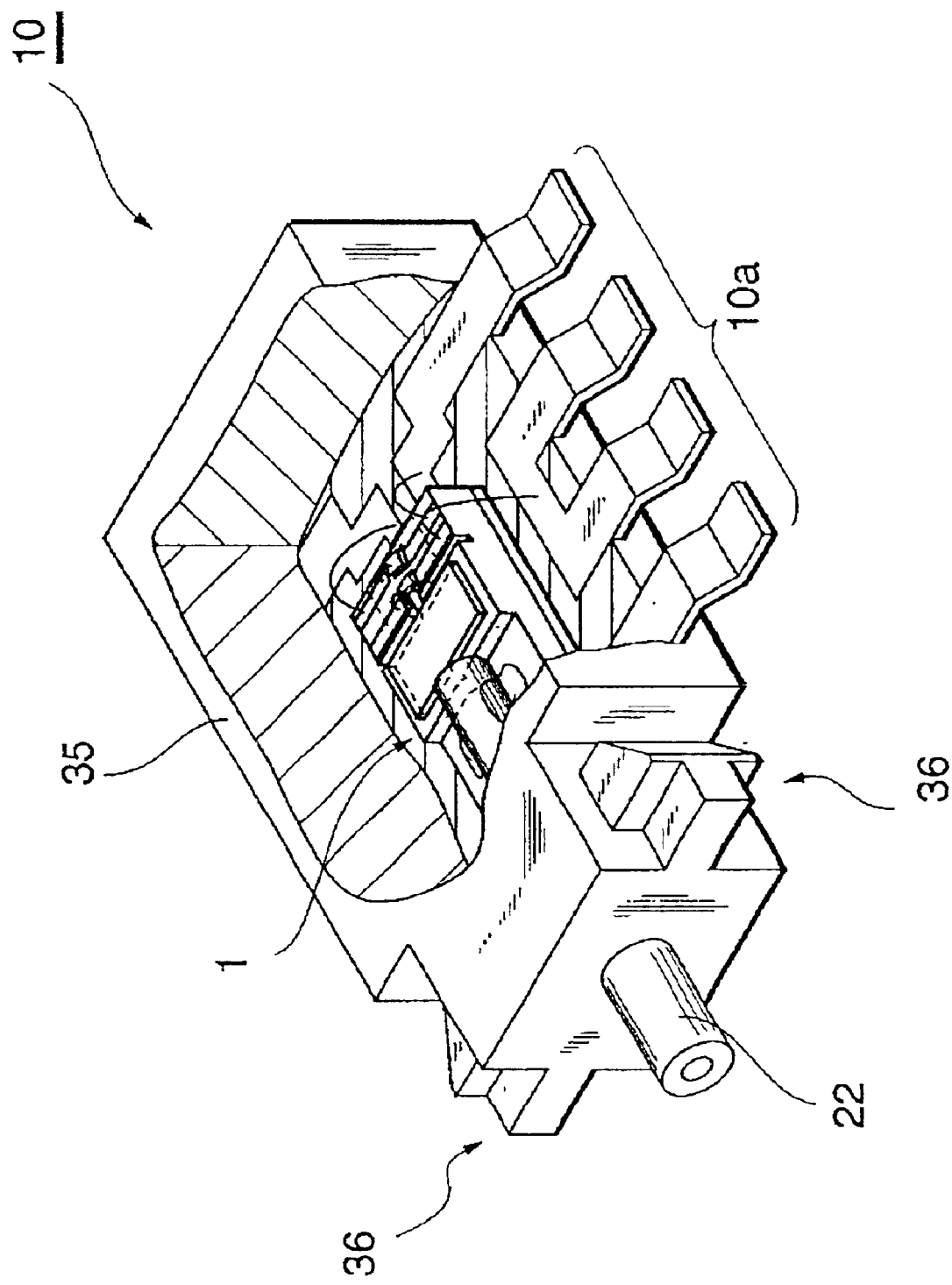
FIG. 9 is a partly cutaway perspective view showing the composition of an optical module.

FIG. 9 is a partly cutaway perspective view showing the composition of an optical module. As shown in the figure, an optical module 10 has the light-emitting device 1, a resin body 35 that accommodates the light-emitting device 1, and terminals 10a that electrically connect the optical device 1 to an outside circuit. Also, the resin body 35 is provided with a coupling portion 36. The ferrule 22 of the fiber stub part 2 protrudes from the resin body 35. The production process of the optical module 10 is explained below.

Figure 10A:
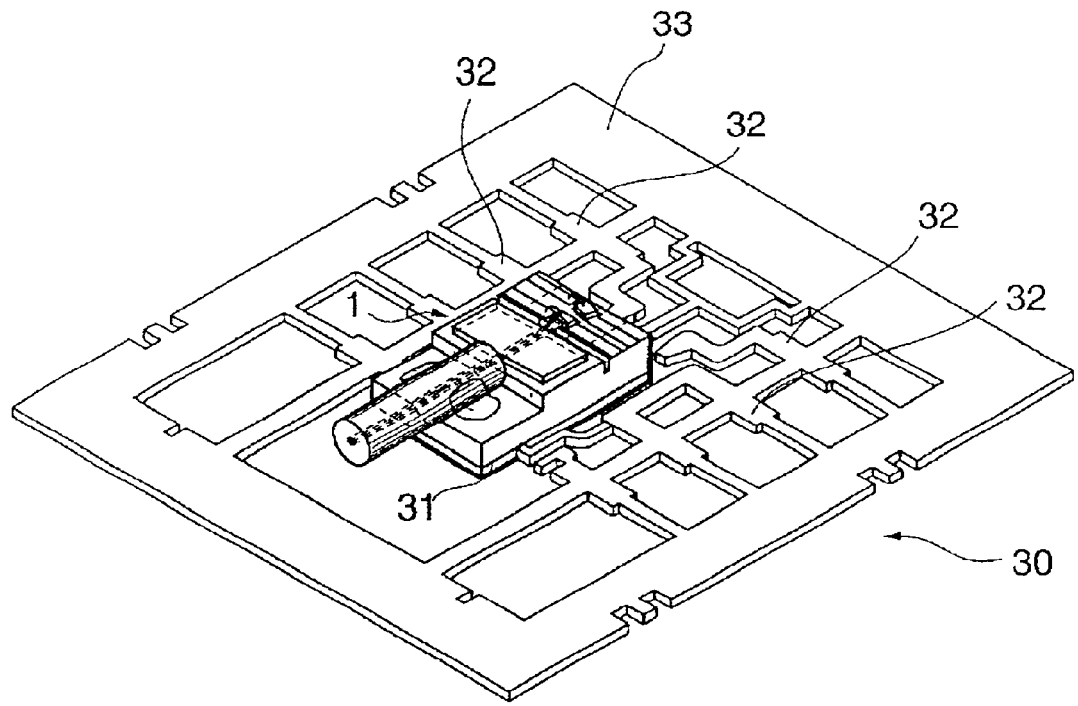
FIGS. 10(a) and (b) illustrate a process for preparing an optical module.

FIGS. 10(a), 10(b), 11(a), and 11(b) illustrate a process for preparing an optical module. As shown in FIG. 10(a), a lead frame part 30 has a die-pad 31 on which the light-emitting device 1 is mounted, a plurality of leads 32 that is to become the terminals of the optical module, and an outer frame 33. The light-emitting device 1 is fixed on the lead frame part 30. That is, a silver paste is applied to the die-pad 31, and after the adjustment in the position of the light-emitting device 1 and the lead frame part 30, the light-emitting device 1 is mounted on the die-pad 31. Thereby, the light-emitting device 1 is fixed to the lead frame part 30.

Figure 10B:
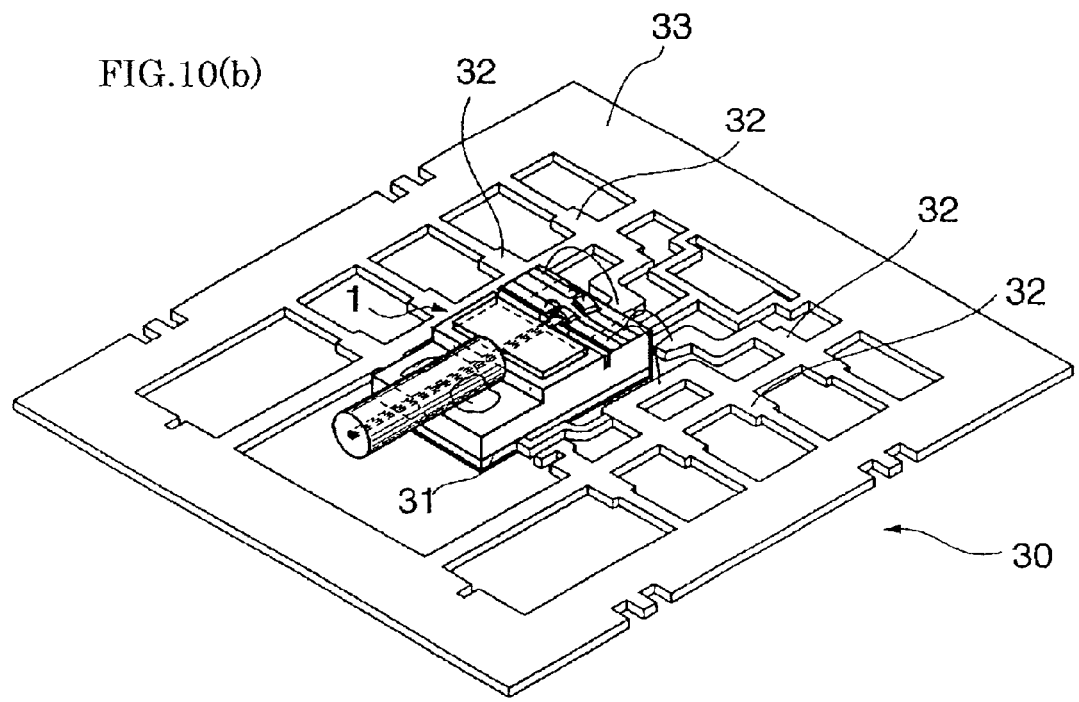
Figure 11A:
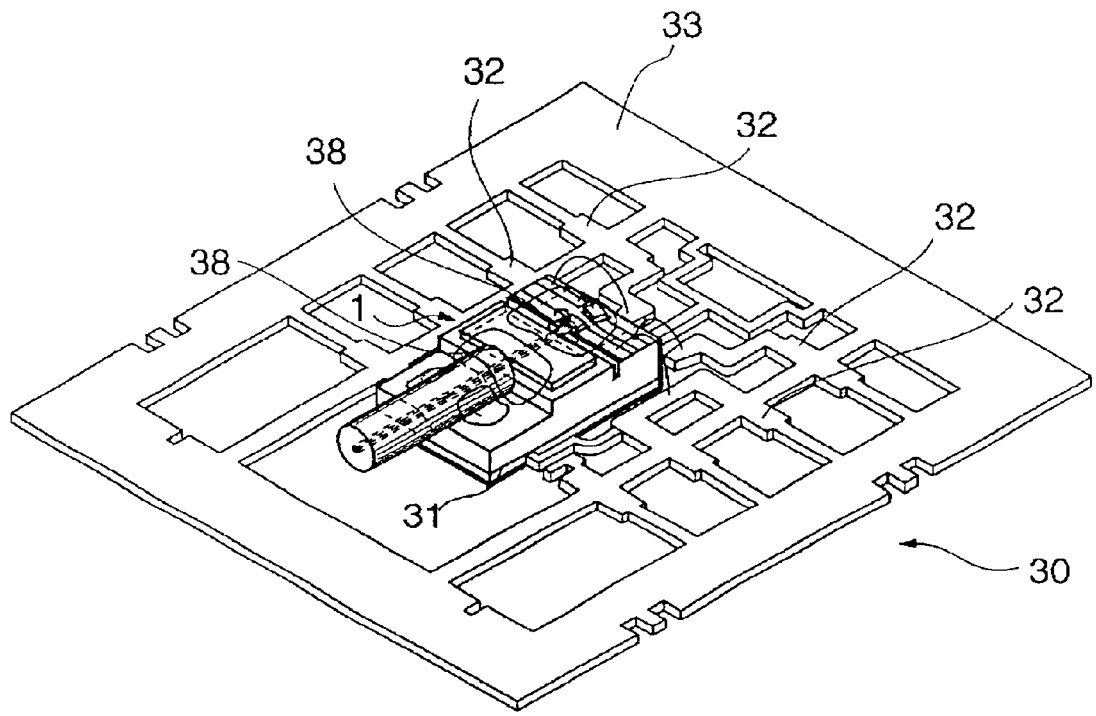
FIGS. 11(a) and (b) illustrate a process for preparing an optical module.
Figure 11B:
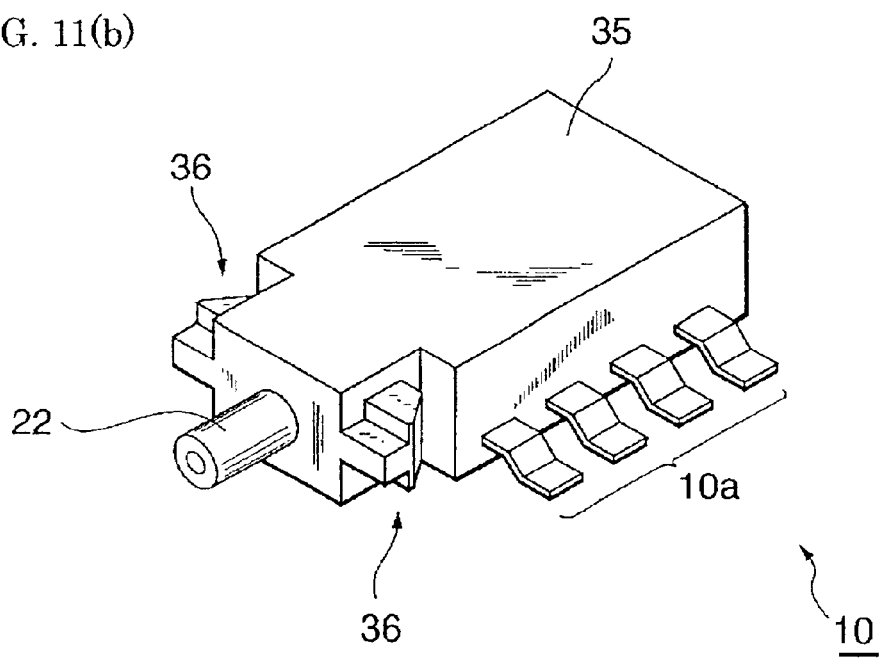

Next, using a bonding wire such as a gold wire, the wirings 54a–54d of the light-emitting device 1 are electrically connected to respective leads 32 (FIG. 10(b)). After that, a silicone-based resin 38 is applied so as to cover the fiber stub part 2, the fixing member 25, the semiconductor optical amplifying device 3, the photodiode 4, and the wirings 54a14 54d (FIG. 11(a)). Then, the light-emitting device 1 and a part of leads 32 are sealed by an epoxy-resin body 35 that is formed by transfer molding. Subsequently, each lead 32 is detached from the outer frame 33 of the lead frame part 30 to form a lead frame. Thus, a gull-wing type optical module 10 is completed as schematically shown in FIG. 11(b). The optical module 10 can have dimensions of about 13 mm in length, about 6 mm in width, and about 4 mm in thickness, for example.

Figure 12:
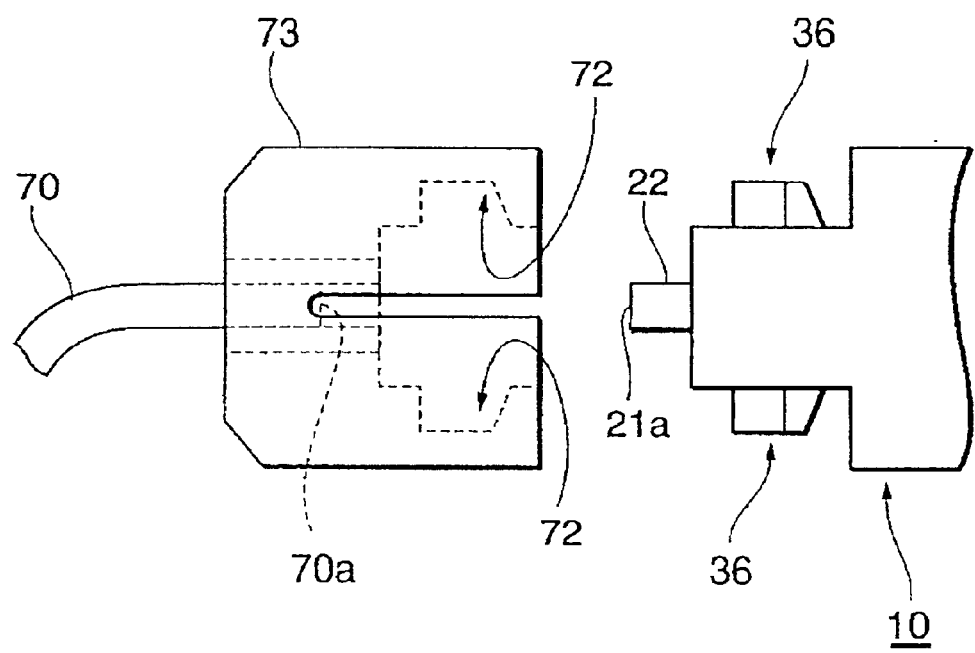
FIG. 12 illustrates an exemplary method for coupling an optical fiber and an optical module.

The optical module 10 is connected to an outside optical fiber as follows. That is, as shown in FIG. 12, the optical module 10 is connected to an optical connector 73. The optical connector 73 is provided at one end of an optical fiber 70. Such connection is made by fitting a coupling portion 36 of the optical module 10 to a coupling portion 72 of the optical connector 73. Thereby, a first end face 21a of a grating fiber and an end face 70a of an optical fiber 70 are optically coupled together. In a manner as described above, the optical fiber 70 is easily and securely connected to the optical module 10. In the optical module 10, the coupling means for connection to an outside optical fiber is formed by the coupling portion 36 provided in the resin body 35 and the ferrule 22 extending from the resin body 35.

Since the optical module 10 has terminals 10a composed of leads 32, it can be mounted on the surface of a circuit board.

(Third Embodiment)

Figure 13:
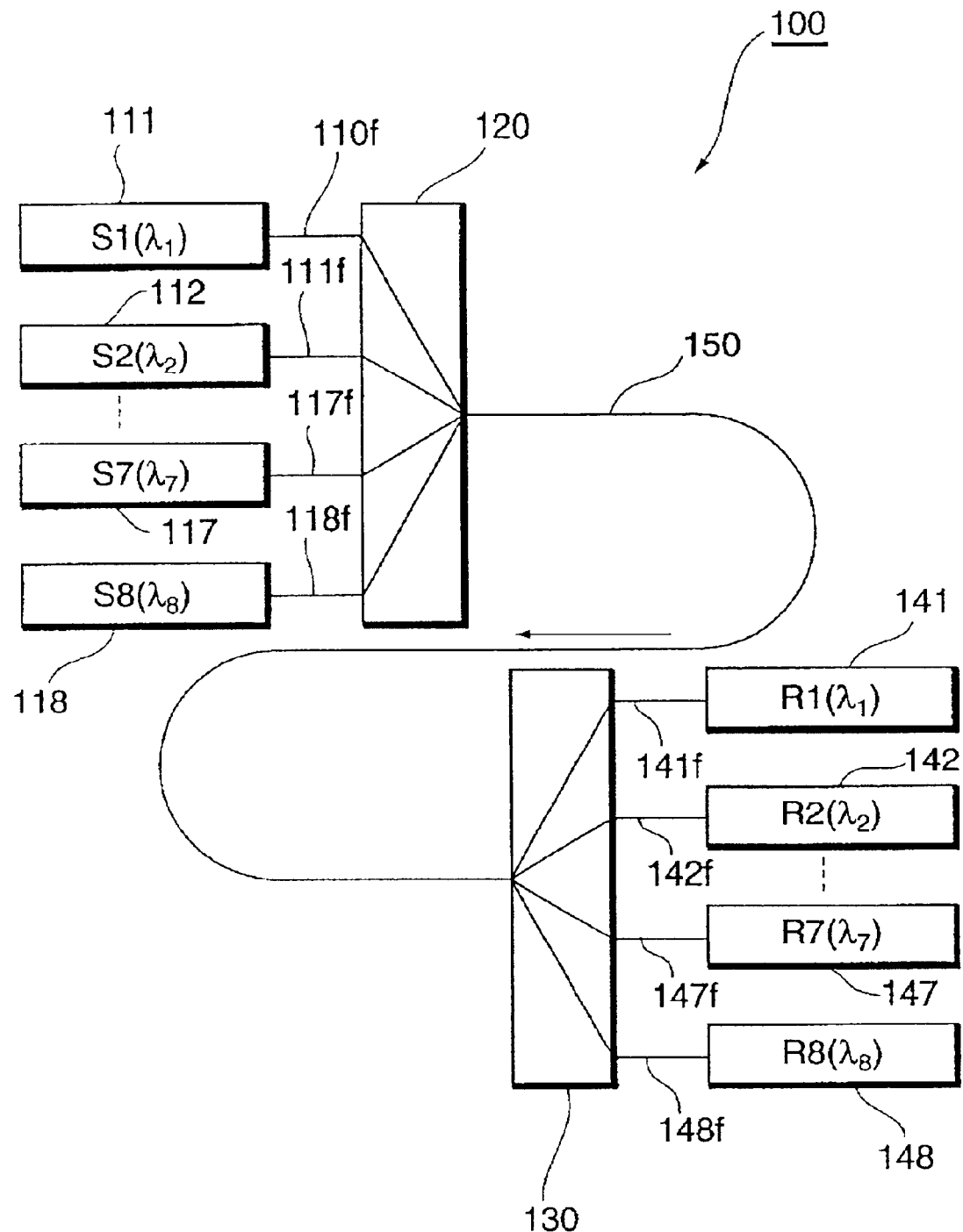
FIG. 13 is a schematic diagram showing the composition of a multi-wavelength optical communication system.

Next, an explanation is given about a multi-wavelength optical communication system in which the optical module 10 is suitably used. FIG. 13 is a schematic diagram showing the composition of the multi-wavelength optical communication system. A multi-wavelength optical communication system 100 has optical transmitter devices 111–118, an optical multiplexer 120, an optical demultiplexer 130, and optical receiver devices 141–148. The multi-wavelength optical communication system 100 is also provided with optical fiber 111f–118f which connect the optical transmitter devices 111–118 and the optical multiplexer 120 together, the optical transmission line 150 which joins the optical multiplexer 120 and the optical demultiplexer 130 together, and optical fibers 141f–148f which connect the optical demultiplexer 130 and the optical receiver devices 141–148 together. Also, the optical transmitter devices 111–118 are respectively connected to output equipment, which is not illustrated, and the output equipment outputs electric signals to the optical transmitter devices 111–118.

The optical transmitter devices 111–118 are provided with eight optical modules with different oscillation wavelengths, respectively. These eight optical modules have the composition that is identical with the optical module 10 except that the wavelength of the oscillation light differs. Therefore, the eight optical modules have the fiber stub parts 2 provided with diffraction gratings 23 whose reflective wavelengths are $\lambda_1$–$\lambda_8$. Therefore, the eight optical modules emit laser light whose wavelengths are $\lambda_1$–$\lambda_8$. To show these wavelengths exemplarily, $\lambda_1$=1536.6 nm, and it is possible to give a relationship such as $\lambda_{i+1}=\lambda_i+3.2$ nm (where i is a natural number equal to or less than 7).

The laser light emitted from the eight optical modules can have a wavelength of the 1300 nm band or the 1480 nm band, not limited to a wavelength of the 1500 nm band. Also, four optical modules having four different wavelengths in the 1300 nm band and four optical modules having four different wavelengths in the 1500 nm band may be used in combination.

In the following, an explanation is given about the operation of multi-wavelength optical communication system 100. Optical transmitter devices 111–118 receive electric signals output from the output equipment. Electric signals are converted into optical signals by the eight optical modules in the optical transmitter devices 111–118. Signal light with wavelengths $\lambda_1$–$\lambda_8$ enters into the optical fibers 111f–118f from the eight optical modules. The laser light with wavelengths $\lambda_1$–$\lambda_8$ is multiplexed into wavelength multiple signal light by the optical multiplexer 120 after reaching the optical multiplexer 120 through the optical fibers 111f–118f. The wavelength multiple signal light reaches the optical demultiplexer 130 through the optical transmission line 150. The wavelength multiple signal light is demultiplexed to signal light with wavelengths $\lambda_1$–$\lambda_8$ by the optical demultiplexer 130, and the signal light thus demultiplexed reaches the optical receiver devices 141–148 respectively through the optical fibers 141f–148f. The optical receiver devices 141–148 convert signal light with wavelengths $\lambda_1$–$\lambda_8$ into electric signals and output them to outside circuits.

In the multi-wavelength optical communication system 100, the optical transmitter devices 111–118 can be downsized, since small optical modules having the same form as the optical module 10 are used in the optical transmitter devices 111–118. Also, the light-emitting devices whose oscillation wavelengths are $\lambda_1$–$\lambda_8$ are easily manufactured by using fiber stubs which are provided with grating fibers for various reflective wavelengths. Therefore, the multi-wavelength optical communication system can be easily achieved using the optical modules 10, and moreover the system can be downsized.

The embodiments of the present invention are not limited to the light-emitting devices and the optical modules described above, and various embodiments are possible. The bench 5 of the above-mentioned light-emitting device 1 was prepared using a silicon substrate, but it may be prepared using ceramics such as alumina ($Al_2O_3$). In the case of using ceramics, the ferrule supporting part 51, the optical fiber supporting part 52, and the trench 53 can be formed by machining. In particular, machining such as dicing can be used for the formation of the trench 53.

Although an explanation of a gull-wing type optical module using the light-emitting device 1 sealed with a resin body was given in the second embodiment of the present invention, various accommodation methods can be adopted for a light-emitting device according to the present invention. Also, the coupling portion of the optical module 10 according to the second embodiment may be chosen depending on the type of an optical connector, without limiting to the form shown in FIG. 8(e).

In the third embodiment, the optical transmitter devices 111–118 are provided with optical modules having substantially the same composition as the optical module 10. However, they may be provided with light-emitting devices 1 according to the first embodiment instead. In such case, the light-emitting devices 1 are mounted on circuit boards in the optical transmitter devices 111–118, and the optical fibers 111f–118f are optically coupled to the light-emitting devices 1.

What is claimed is:

1. A light-emitting device comprising:

a fiber stub part comprising a grating fiber having one end, other end and a diffraction grating, and a ferrule having one pair of end faces;

a semiconductor optical amplifying device having a light-reflecting face and a light-emitting face which is optically coupled to one end of said grating fiber;

a bench having first, second and third regions arranged along a given axis, and an external cavity comprising a face of the semiconductor optical amplifying device and the diffraction grating of the grating fiber;

said grating fiber having a first part and a second part that are provided between said one end and said other end, said ferrule being disposed in said first part, the other end of said grating fiber being exposed at one of one pair of end faces of said ferrule, said first region of said bench having a ferrule supporting part extending along a given axis for supporting said ferrule, said second region having an optical fiber supporting part extending along said given axis for supporting said grating fiber, and said third region having a device supporting part on which said semiconductor optical amplifying device is mounted, wherein said bench has a positioning face that intersects said given axis between said second region and said third region, and that contacts said one end of said grating fiber, whereby said positioning face determines a resonator length.

2. A light-emitting device according to claim 1, wherein said ferrule is disposed in said first part and said diffraction grating is provided in said second part.

3. A light-emitting device according to claim 1, wherein said ferrule and said diffraction grating are arranged in said first part.

4. A light-emitting device according to claim 1, wherein said bench consists of ceramics.

5. A light-emitting device according to claim 1, wherein said bench consists of silicon.

6. An optical module comprising:

a light-emitting device of claim 1; and a housing for accommodating said light-emitting device, a first end face of said ferrule being located outside said housing.

7. An optical module comprising:

a light-emitting device of claim 1;

a lead frame for mounting said light-emitting device, and a resin body for sealing said light-emitting device and said lead frame;

said lead frame having a plurality of lead terminals, a first end face of said ferrule being positioned outside, said plurality of lead terminals protruding outside.

8. A light-emitting device according to claim 1, wherein the light-reflecting face of the optical amplifying device and the diffusion grating form the external cavity.

* * * * *